(12) United States Patent
Walde et al.

(10) Patent No.: US 6,876,205 B2
(45) Date of Patent: Apr. 5, 2005

(54) STORED ENERGY ARC DETECTION AND ARC REDUCTION CIRCUIT

(75) Inventors: Hendrik Walde, Fort Collins, CO (US); Brian Kowal, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 132 days.

(21) Appl. No.: 10/456,421

(22) Filed: Jun. 6, 2003

(65) Prior Publication Data

US 2004/0245999 A1 Dec. 9, 2004

(51) Int. Cl.[7] .......................... G01R 31/08; H01H 9/50; C23C 14/00; C25B 11/00
(52) U.S. Cl. .............. 324/536; 204/298.08; 204/192.12
(58) Field of Search ............................ 324/536, 158.1, 324/71.1; 204/192.38, 192.12, 192.13, 298.08; 219/76.17, 121.36

(56) References Cited

U.S. PATENT DOCUMENTS 5,415,757 A * 5/1995 Szcyrbowski et al. . 204/298.08
5,584,974 A * 12/1996 Sellers .................. 204/192.13
5,815,388 A * 9/1998 Manley et al. ................ 363/63

* cited by examiner

*Primary Examiner*—N. Le
*Assistant Examiner*—Amy He
(74) *Attorney, Agent, or Firm*—Benjamin Hudson, Jr.

(57) ABSTRACT

This invention teaches an arc detection and arc reduction circuit for use with power supplies for delivering power to a plasma processing system that utilizes a resonant circuit that stores energy and when the voltage drops between the cathode and anode of the processing chamber the stored energy generates a current in a current transformer in response to the voltage change to switch a magnetically coupled inductor in parallel with the cathode and anode causing a reversal of the voltage that reduces arcs in the plasma chamber. In an alternate embodiment the magnetically coupled inductor is replaced by a pulse transformer and the pulse transformer is placed in parallel with the cathode and anode causing a reversal of the voltage that reduces arcs in the plasma chamber.

5 Claims, 2 Drawing Sheets

STORED ENERGY ARC DETECTION AND ARC REDUCTION CIRCUIT

BACKGROUND OF THE INVENTION

1. Field of the Invention

This invention relates generally to power supply systems for supplying power to plasma processing systems, and more particularly to power supply systems with arc detection and arc reduction capabilities for eliminating arcs generated in a plasma processing chamber.

2. Brief Description of the Preferred Embodiment

In plasma processing systems a DC power supply creates an electric potential between a cathode and anode to create plasma. In the deposition mode, the plasma then acts upon a material target to create a thin film on some substrate. One of the challenges in many such applications is that electrical discharges or arcs can occur. As one example, a reactive coating process is particularly challenging because it often involves forming insulating regions on the material target and bombarding them with ions. This leads to charging of the insulating regions which can cause electrical breakdown of the insulator. As a result, the electrical environment during plasma processing can be particularly conducive to arc discharges. These arc discharges are undesirable not only because they represent potential non-uniformities in the coating process, but also because they can lead to the creation of particulates which can in turn create defects in sensitive items such as computer disks and integrated circuits processing. One solution has been the utilization of frequency-oriented components to discharge a capacitor through an inductor in such a way as to reverse the current to negate or quench the arc.

Most arc reduction circuits utilize a voltage detector to detect arcs. In these circuits a logic circuit and a low voltage power supply has to be added to the power supply or other arc reduction equipment to power the arc reduction features. Also, the circuit needs to be disabled at startup of the power supply to avoid false arc trips. This is especially critical, if the power supply has to start into a low impedance load, like into a chamber with another plasma discharge already existent. Additionally, the arc detection to a low voltage level can cause a substantial delay to the arc detection or even ignore higher voltage arcs often observed in plasma processes. Lastly, the arc detection and reduction should be simple reliable and control the switches to remove the energy from the plasma discharge quickly. The speed of the reaction to turn off the arc is very important. If the arc is turned off is too fast, the arc density over time can increase and a long-term stable process may be difficult to obtain. If the arc is turned off too slow, the energy fed into the arc can be too big and can reduce the quality of the film or the substrate.

It would be desirable if there were provided an arc detection and arc reduction circuit that was simple and reliable without the need for complicated detection circuits and auxiliary power supplies. It would also be desirable if the circuit did not utilize high voltage bridging components.

SUMMARY OF THE INVENTION

There is provided by this invention a novel arc detection and arc reduction circuit that is generally comprised of a means to store energy while power is delivered to a plasma processing process eliminating the need for an auxiliary power supply. The arc reduction is accomplished by reversing the voltage to the plasma process by either a tapped inductor with the typical voltage source or through the resonant ringing circuitry with a typical current source that limits the reverse peak current.

BRIEF DESCRIPTION OF THE PREFERRED EMBODIMENT

Figure 1:
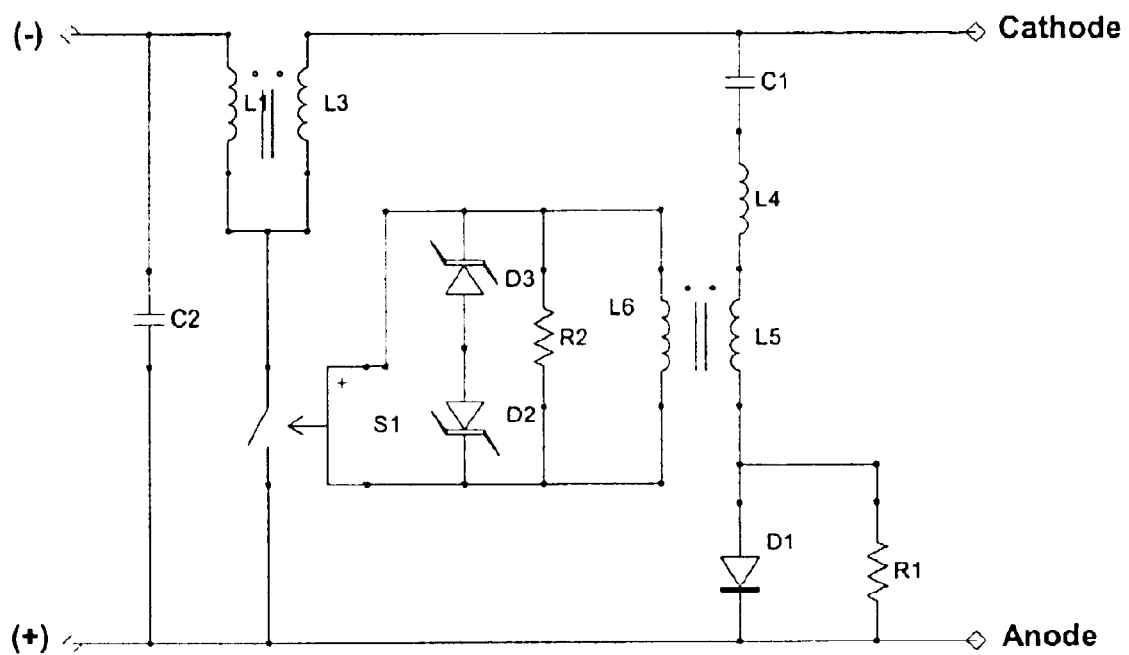
FIG. 1 illustrates an arc detection and reduction circuit that incorporates the principles of this invention.

There is shown in FIG. 1 an arc detection and reduction circuit that may either be incorporated into a typical power supply designed to deliver power to a plasma process or it may be self contained and mounted in close proximity to the plasma chamber and connected to the power supply via transmission lines.

The power supply is connected to the positive and negative inputs of the arc diverter, which is comprised of the tapped inductor L1 and L3, the resonant circuit C1, L4, D1 and R1, the current transformer L5 and L6 and the switch S1.

Any reduction in the potential $\Delta V$ between anode and cathode will generate a resonant current $I=\Delta V/Z$. Where Z is the characteristic impedance of C1 and L4.

The current transformer L5 and L6 creates a current in the resistor R2, which turns on the switch S1, if the voltage across R2 is above the threshold of the switch S1.

The condition for turning on the switch S1 is given by the equation $$\Delta V > (V_{th} * N * Z)/R2$$

with $V_{th}$—Threshold voltage of the switch
N—The turn ration of the current transducer L6/L5
Z—The characteristic impedance of C1 and L4
To avoid a continuous turning on of the switch the resistor R1 should be bigger than $$R1 > 4*Z.$$

The proposed solution is designed to reverse the potential across the plasma discharge, if the potential falls more than $\Delta V$.

This will ensure a safe startup and very sensitive arc reduction at the same time using a self-feeding switching circuit without the requirement of an external energy source to feed the circuit. It is important to design the capacitor C2 sufficient to maintain a reverse voltage during the arc reduction at least for the fall time of the current into the arc.

Figure 2:
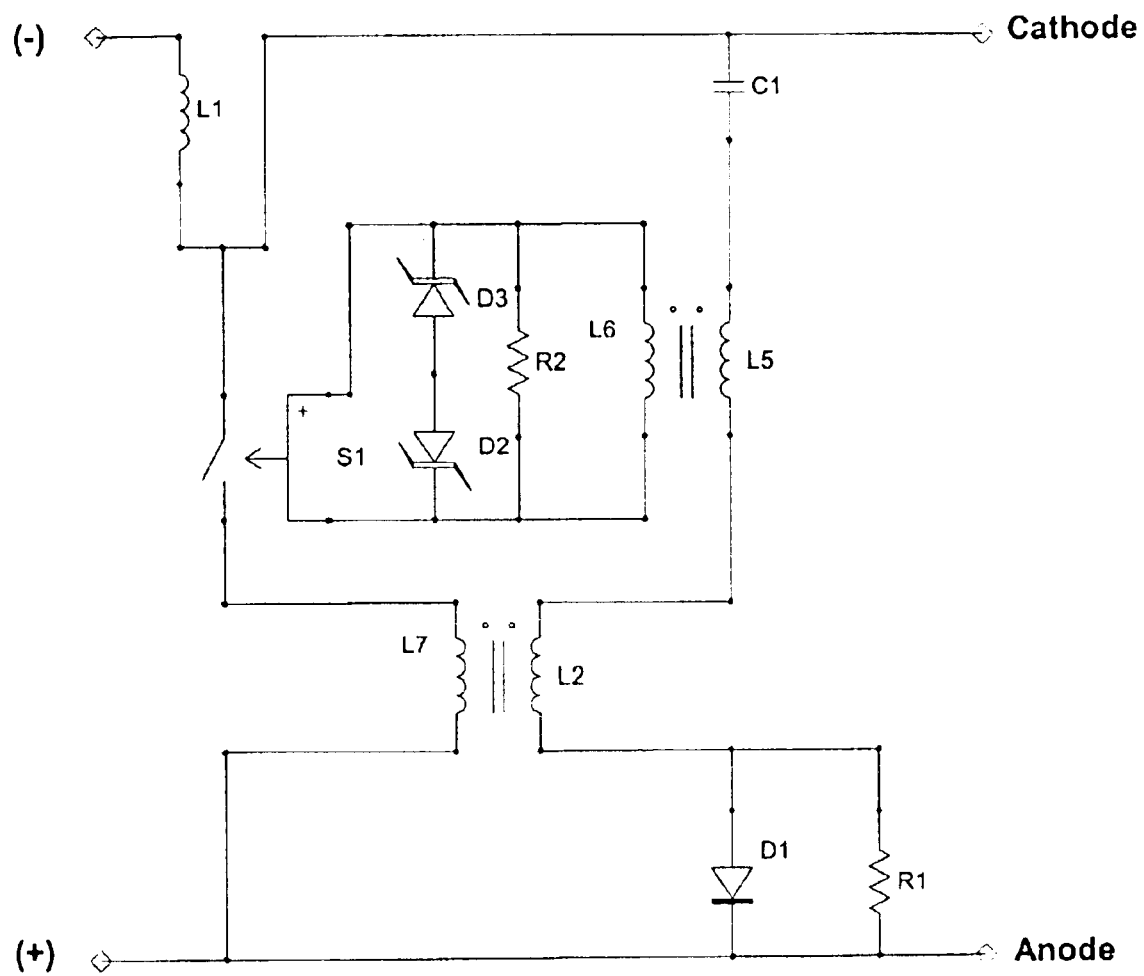
FIG. 2 illustrates an alternate embodiment of an arc detection and reduction circuit that incorporates the principles of this invention.

Referring to FIG. 2 there is shown an alternate embodiment of the arc reduction circuit that does not utilize the coupled inductor L1/L3. The resonant inductor L4 is replaced with the inductor L2. The transformer L2 and L7 generate the reverse voltage to reduce the arc energy.

This has the advantage to reduce the cost of the main inductor and the input capacitor by replacing the secondary winding with a much simpler pulse transformer.

The condition for this circuit to reverse the voltage is fulfilled, if the current through L2 times the transformer ration of L2 and L7 is bigger than the current through L1. Often the input inductor L1 is already included in the power supply or in the cable inductance thus the current through L1 represents the output current of the power supply. By removing this input inductor a very simple and small circuit can be arranged very close to the plasma chamber reducing the possible arc energy at the chamber. The timing of this circuit is adaptable to the requirements of the process. In SIP-processes the shutdown time should be very short (<10 us) not to interrupt the stream of generated metal ions.

It can readily be seen that there is provided herein a novel and unique arc detection and arc reduction circuit that is simple and reliable utilizing stored energy to provide fast and reliable detection and reduction of arc currents.

Although there is illustrated and described specific structure and details of operation, it is clearly understood that the same were merely for purposes of illustration and that changes and modifications may be readily made therein by those skilled in the art without departing from the spirit and the scope of this invention.

We claim:

1. An arc detection and arc reduction circuit for use with a power supply to deliver power to a plasma chamber comprising;
    a) positive and negative input terminals for connection with the output of a power supply disposed to deliver dc power to a plasma chamber;
    b) a magnetically coupled inductor connected to a switching circuit for switching the coupled inductor in parallel with the cathode and anode of a plasma chamber;
    c) a resonant circuit comprising capacitor for storing energy and an inductor connected between the cathode and anode of the plasma chamber wherein the resonant circuit responds to a voltage change between the cathode and anode and the stored energy generates a current in a current transformer in response to the voltage change;
    d) the current transformer is connected to the switching circuit wherein the magnetically coupled inductor is placed in parallel with the cathode and anode causing a reversal of the voltage that reduces arcs in the plasma chamber.

2. An arc detection and arc reduction circuit for use with a power supply to deliver power to a plasma chamber as recited in claim 1 wherein the condition of turning on the switch is determined when the voltage drop is equal to the product of the threshold voltage of the switch, the turns ration of the current transformer, and the impedance of the capacitor and inductance divided by the resistance in the switching circuit.

3. An arc detection and arc reduction circuit for use with a power supply to deliver power to a plasma chamber comprising;
    a) positive and negative input terminals for connection with the output of a power supply disposed to deliver de power to a plasma chamber;
    b) a pulse transformer connected to a switching circuit for switching the pulse transformer in parallel with the cathode and anode of a plasma chamber;
    c) a capacitor for storing energy connected between the cathode and anode of the plasma chamber wherein the capacitor responds to a voltage change between the cathode and anode and the stored energy generates a current in a current transformer in response to the voltage change;
    d) the current transformer is connected to the switching circuit wherein the pulse transformer is placed in parallel with the cathode and anode causing a reversal of the voltage that reduces arcs in the plasma chamber.

4. An arc detection and arc reduction circuit for use with a power supply to deliver power to a plasma chamber as recited in claim 3 wherein a parallel diode and resistor circuit is placed in series with the pulse transformer to limit the reverse peak current.

5. An arc detection and arc reduction circuit for use with a power supply to deliver power to a plasma chamber as recited in claim 3 wherein the condition of turning on the switch is determined when the output current of the power supply is less than the product of the current through the primary of the pulse transformer and the turns ratio of the primary and secondary of the pulse transformer.

* * * * *